United States Patent [19]

Costogue et al.

[11] 4,149,665
[45] Apr. 17, 1979

[54] BONDING MACHINE FOR FORMING A SOLAR ARRAY STRIP

[76] Inventors: Robert A. Frosch, Administrator of the National Aeronautics and Space Administration, with respect to an invention of Ernest N. Costogue, Tujunga; Roy G. Downing, Torrance; Orwin Middleton, Reseda; Robert L. Mueller, Azusa; Robert K. Yasui, Monterey Park; Fred J. Cairo, Los Angeles; Jerry K. Person, Los Angeles, all of Calif.

[21] Appl. No.: 848,794

[22] Filed: Nov. 4, 1977

[51] Int. Cl.$^2$ .............................................. H01L 31/18
[52] U.S. Cl. ............................... 228/5.1; 228/6 A; 29/572; 29/574; 29/739; 29/809
[58] Field of Search ............... 228/5.1, 6 R, 6 A; 29/739–741, 759, 809, 572, 574, 588

[56] References Cited
U.S. PATENT DOCUMENTS

| | | | |
|---|---|---|---|
| 3,231,968 | 2/1968 | Swanson | 29/809 X |
| 3,486,223 | 12/1969 | Butera | 219/85 BM X |
| 3,502,507 | 3/1970 | Mann | 136/89 P |
| 3,724,068 | 4/1973 | Galli | 228/6 A X |
| 3,742,181 | 6/1973 | Costello | 219/85 BA |
| 3,930,809 | 1/1976 | Evans | 228/6 A X |
| 3,973,996 | 8/1976 | Kennedy | 29/572 X |
| 4,050,618 | 9/1977 | Angelucci et al. | 228/5.5 |
| 4,086,102 | 4/1978 | King | 29/572 X |

*Primary Examiner*—C. W. Lanham
*Assistant Examiner*—Kenneth J. Ramsey
*Attorney, Agent, or Firm*—Monte F. Mott; John R. Manning; Wilfred Grifka

[57] ABSTRACT

A machine for attaching solar cells to a flexible substrate having printed circuitry deposited thereon. The strip is fed through a first station in which solar cells are elevated into engagement with solder pads for the printed circuitry and thereafter heated by an infrared lamp, a second station at which flux and solder residue is removed, a third station at which electrical performance of the soldered cells is determined, a fourth station at which an encapsulating resin is deposited on the cells, a fifth station at which the encapsulated solar cells are examined for electrical performance and a final station at which the resulting array is wound on a take-up drum.

19 Claims, 13 Drawing Figures

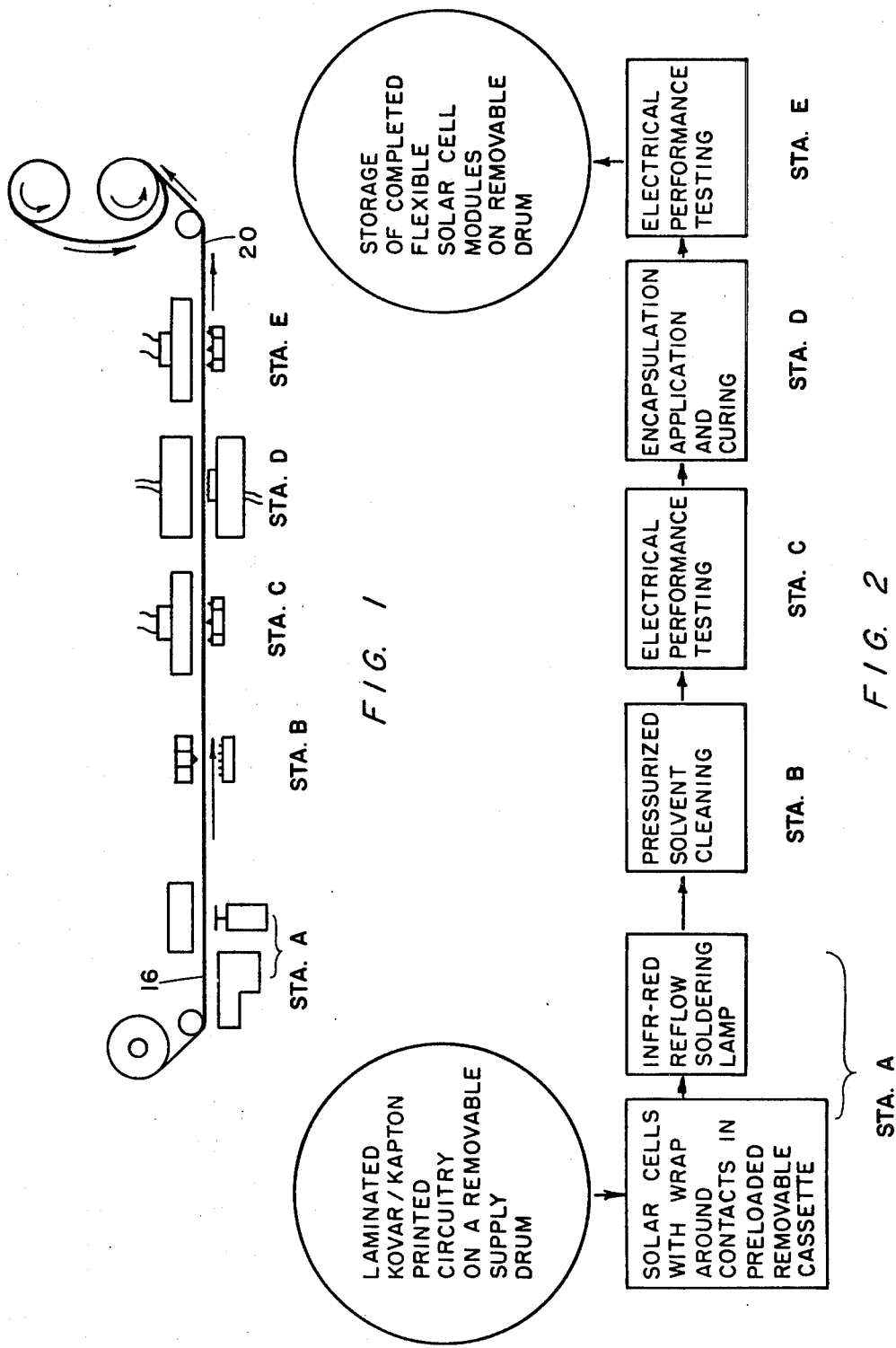

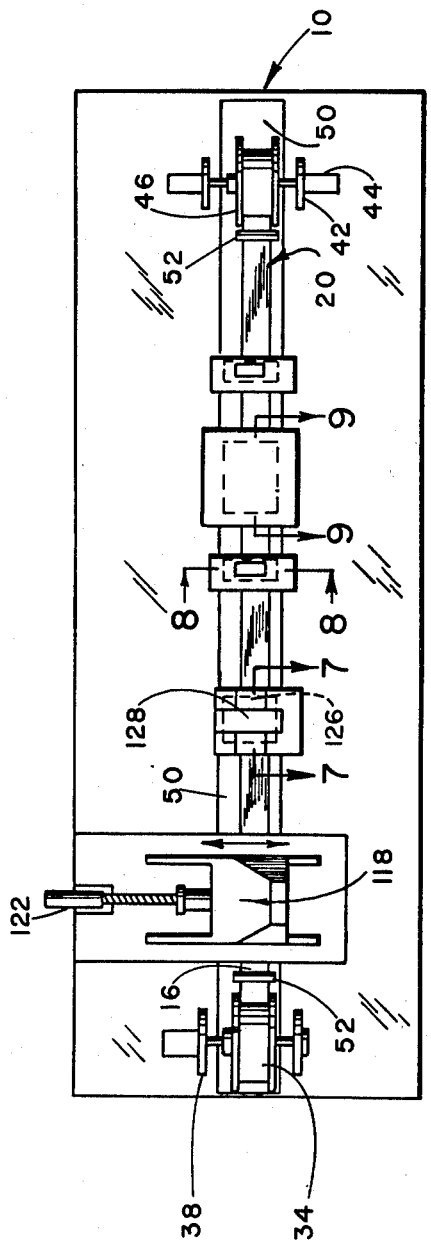
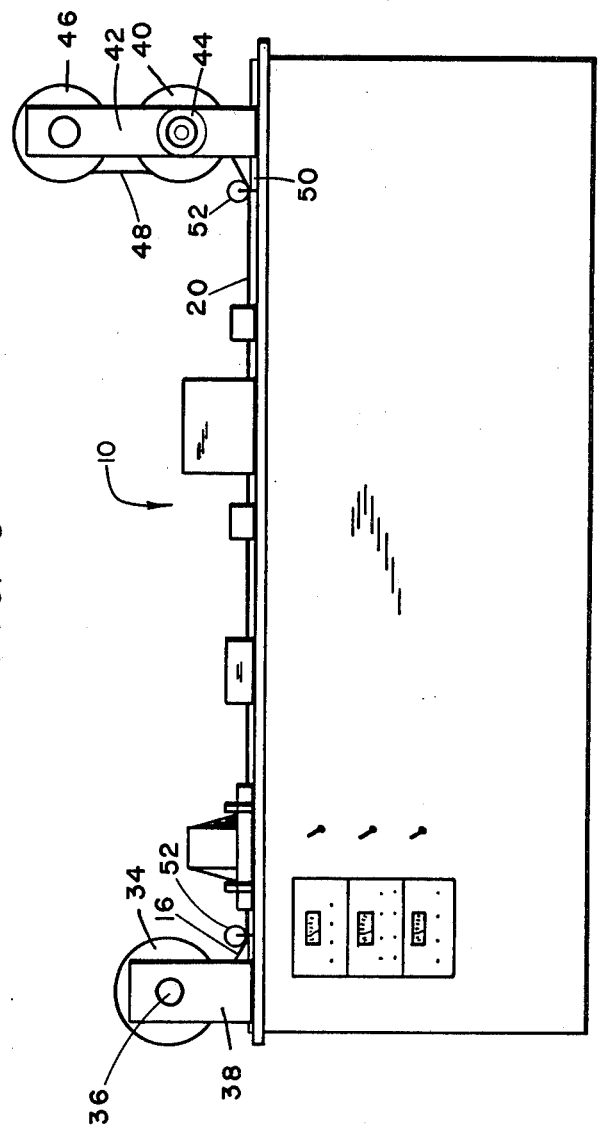
FIG. 3
FIG. 4

BONDING MACHINE FOR FORMING A SOLAR ARRAY STRIP

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

The invention herein disclosed relates to applicants' invention disclosed and claimed in application Ser. No. 809,890, filed June 24, 1977.

BACKGROUND OF THE INVENTION

1. Field of the Invention

The invention generally relates to machines for forming solar arrays and more particularly to a machine for forming a flexible solar array strip adapted to be stored in a helically wound roll.

2. Description of the Prior Art

The prior art is, of course, replete with solar arrays as well as methods and machines for forming the same. Moreover, it is known that arrays of solar cells may be fabricated utilizing flexible substrates and that the resulting arrays have particular utility aboard spacecraft and similar vehicles. Unfortunately, as can readily be appreciated by those familiar with the fabrication of solar arrys, the general utility of previously available solar arrays is impaired due to the apparent complexity of the known fabrication techniques and attendant excessive costs in terms of time and materials.

With the advent of renewed interest in and the placing of emphasis on developmental efforts calculated to reduce costs in the production of electrical energy from solar flux and the like, it has become apparent that there currently exists a need for a practical machine suitable for use in automating the fabrication of dependable solar cell arrays.

It is, therefore, the general purpose of the instant invention to provide an improved practical and feasible machine for forming solar array strips characterized by generality in converting solar flux to electrical energy.

OBJECTS AND SUMMARY OF THE INVENTION

It is an object of the invention to provide a machine which overcomes the aforementioned difficulties and disadvantages.

It is another object to provide a machine for economically forming solar array strips.

It is another object of the instant invention to provide an improved machine for forming flexible solar array strips.

It is another object of the instant invention to provide a machine for use in the automation of fabrication of solar array strips.

It is another object to provide a machine having a plurality of stations at which solar cells are sequentially attached to a printed circuit deposited on a flexible strip, cleaned, tested and wound to a spiral configuration.

It is another object to provide in a machine for forming solar array strips an improved mechanism for orienting and soldering solar cells to a printed circuit mounted on a flexible substrate.

It is another object to provide in a machine for forming solar array strips a cleaning station at which flux and solder residue is removed from between opposed surfaces of solar cells and a flexible substrate.

It is another object to provide in an improved machine for forming solar array strips a testing station having a plurality of probes for determining the electrical performance of solar cells attached on a flexible strip.

These and other objects and advantages are achieved through the use of a machine characterized by a plurality of stations through which a flexible substrate having printed circuitry deposited thereon is advanced for receiving solar cells in soldered relation, having the flux and solder residue removed therefrom, the electrical performance thereof determined, encapsulated in a protective film, and finally stored in a helical configuration, as will become more readily apparent by reference to the following claims in light of the accompanying drawings.

BRIEF DESCRIPTION OF THE DRAWINGS

FIG. 1 is a diagrammatic view schematically illustrating relationships for the stations of a machine which embodies the principles of the present invention.

FIG. 2 is a diagrammatic view further depicting the machine schematically.

FIG. 3 is a top plan view of the machine illustrating a plurality of stations schematically depicted in FIGS. 1 and 2.

FIG. 4 is a side elevational view of the machine.

DESCRIPTION OF THE PREFERRED EMBODIMENT

Figure 5:
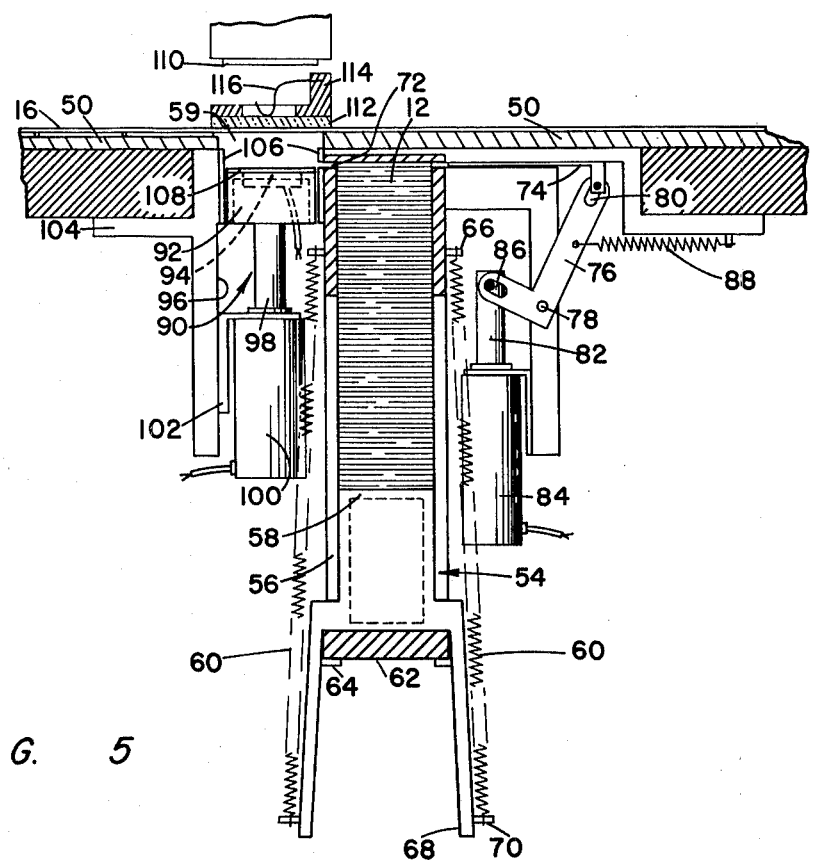
FIG. 5 is a vertically sectioned view of a magazine and an associated lift employed for delivering solar cells to the flexible substrate at a station schematically illustrated in FIGS. 1 and 2.

Referring now to the drawings with more particularity, wherein like reference characters designate like or corresponding parts through the several views, there is depicted, in FIGS. 1 and 2, stations included within a machine which embodies the principles of the instant invention.

It is important to note that the machine serves to perform the method disclosed and claimed in the aforementioned application of which this application is a continuation-in-part. Briefly, the machine, herein generally designated 10, is provided with stations, designated station A through station E.

The solar cells, designated 12, first are elevated into contact with printed circuitry 14 deposited along a surface of a flexible substrate 16 and thereafter soldered thereto in response to a heating of solder pads 18. The substrate is then advanced for positioning the solar cells at station B. At this station, pressurized solvent is applied to the surfaces thereof for removing solder residue. Thereafter, the cells are advanced from station B and are positioned at station C whereupon electrical performance testing is performed for purposes of determining the electrical continuity of the cells and the printed circuit to which they are attached. Of course, inoperativeness of deflective solar cells and related circuitry is here detected.

Figure 13:
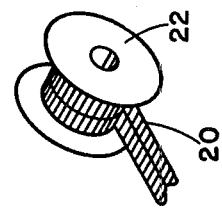
FIG. 13 is a perspective view depicting one configuration in which the solar array strip is stored.
Figure 10:
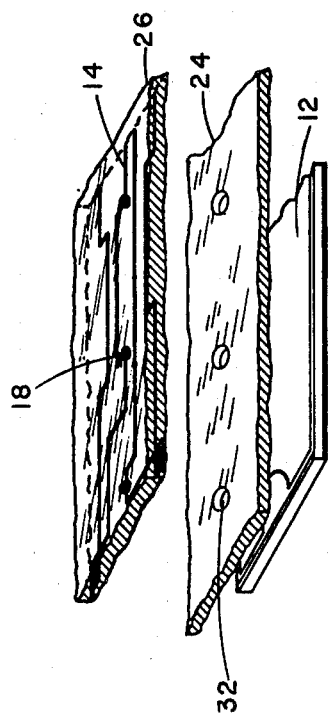
FIG. 10 is a fragmented, partially exploded, perspective view of a segment of the flexible solar array fabricated employing the machine of the instant invention.

The solar cells are then advanced to station D at which an encapsulating material is applied to the surface thereof and cured for providing a protective film or layer along the exposed surfaces of the solar cells 12.

Where desired, the cells and substrate are subject to final electrical performance testing at station E for evaluating the electrical performance for the encapsulated cells prior to removal and storage. Finally, the thus fabricated and tested flexible solar array strip, designated 20, FIG. 13, is provided. As illustrated in FIG. 13, the solar array strip ultimately is wound helically about a drum, designated 22, for storage purposes.

Figure 12:
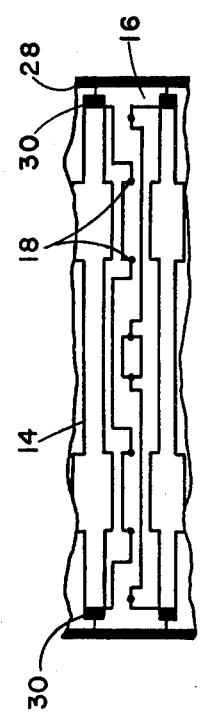
FIG. 12 is a fragmented view depicting a printed circuit mounted on a substrate for the solar array strip.
Figure 9:
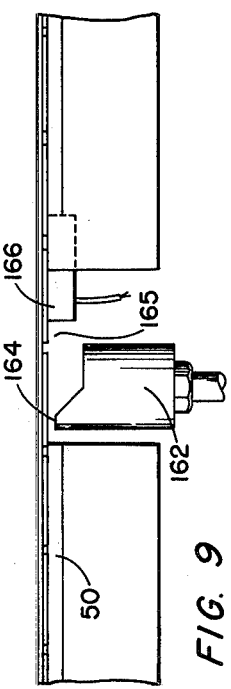
FIG. 9 is a cross sectional view taken generally along line 9—9 of FIG. 3.

It is to be understood that the solar array strip and technique for forming the same is fully described in the aforementioned patent application. However, referring for a moment to FIG. 12, it is noted that the substrate 16, along which is deposited the printed circuitry 14, is formed employing a pair of laminated layers 24 and 26, each being of approximately 0.001 in thickness. As a practical matter, the substrate is formed of Kapton polyimide file (type H) bonded together employing proven techniques. Between the layers 24 and 26 there is deposited the printed circuitry 14, aforementioned. In practice, the printed circuitry is approximately 0.0012 inches thick and is repeated twelve times in a three quarter inch length of the strip on 0.82 inch center lines.

It will be appreciated that the printed circuitry 14 is deposited employing known techniques and comprises conductors preferably formed of copper and other suitable materials. The substrate 16 is fabricated to include strips of metallization 28 extending along both sides of the printed circuitry and connected to the circuitry at a plurality of index tabs 30. The solar cells 12 ultimately are deposited on the substrate 16 in edge-to-edge engagement along transverse center lines bisecting oppositely oriented index tabs 30 and connected to the circuitry at the solder pad 18 as the solder pads are first heated and then cooled. As a practical matter, the layer 24 of the substrate 16 is provided with a plurality of perforations 32 in registry with the solder pads, through which electrical contact is established between the solder pads 18 and the adjacent surfaces of the solar cells 12. It is noted that the cells 12 are of the type commonly referred to as "wrap around" solar cells which facilitate a connecttion thereof to a circuit along one surface thereof. Additionally, the perforations 32 accommodate access to the solder pads 18 for purposes of accommodating electrical performance testing.

It is to be understood that the flexible substrate 16 is supplied to station A of the machine 10 with the printed circuit having been deposited thereon previously. A removable drum 34 supported by a suitable bearing structure 36 mounted on a pair of uprights 38 is provided and employed as a supply drum for the substrate, FIGS. 3 and 4. Similarly, the array fabricated by the machine 10, comprising the solar array strip 20, is stored in its completed form on a removable storage drum 40. This drum also is mounted on uprights, designated 42, and driven intermittently through an electrically energizable motor 44. In practice, a supply drum 46 also is mounted on the uprights 42 and serves to feed a protective layer 48 between the helical layers of the solar array strip 20 as the strip is wound about the storage drum 40. Thus the substrate 16 is fed from a supply drum and taken up as a completed array by the storage drum 40.

Extended between the supply drum 34 and the storage drum 40, there is provided a substantially friction-free track. As a practical matter, the track 50 is faced with a bearing material, such as Teflon or the like, and affords support to the substrate 16 as it is advanced through the machine. It is important to note that the substrate 16 is intermittenly advanced through stations A through E, as the motor 44 is intermittently energized, for ultimate delivery to the storage drum 40. Moreover, as best shown in FIG. 3, the substrate 16 is continuously urged into engagement with the track 50 by a pair of hold down rollers 52, of suitable design, provided at each of the opposite ends of the track, in close proximity with stations A and E. The rollers 52, of course, serve as guide rollers for guiding the flexible substrate as it exits the supply drum 34 and enters the storage drum 40.

Located at station A there is a spring-loaded magazine, generally designated 54, FIG. 5, the purpose of which is to feed, serially, pairs of solar cells 12 arranged in a transverse orientation with the substrate 16. As a practical matter, the cells 12 of each pair are arranged in side-by-side coaxial alignment and are transversely related to the track 50. The magazine 54 includes a pair of vertically oriented guide members 56 arranged in spaced parallelism disposed for supporting the cells as they are advanced vertically. A spring loaded slide 58 serves to support the pairs of solar cells arranged in side-by-side stacks, not designated. The slide continuously is urged upwardly by a plurality of springs 60 connected thereto. In practice, a removable stop 62 is provided for locking the slide 58 within the magazine 54. While the particular manner in which the stop is inserted may be varied as desired, currently, brackets 64 are provided and serve quite satisfactorily for this purpose.

Similarly, while the tension springs 60 are shown anchored at brackets 66 and connected to the slide 58 through a pair of legs, designated 68, at mounting brackets 70, other devices may be employed equally as well for purposes of continuously urging the slide to advance upwardly within the magazine.

In any event, it is important to note that at the uppermost end of the magazine 54 there is provided a laterally projected discharge throat 72. Through this throat the solar cells 12 are serially discharged from the magazine 54. In practice, the cells 12 are fed in pairs as they are forced to move horizontally through the throat in response to an engagement with a laterally moving discharge shuttle 74.

The shuttle 74 is aligned with the throat mounted in a suitable track, not designated, and supported for rectilinear reciprocation for serially engaging and advancing the cells through the throat 72. Reciprocation is imparted to the shuttle by a bell crank 76 pivotally connected for oscillatory motion about a bearing pin 78. The bell crank 76 is connected with the shuttle 74 through a suitable lost-motion-linkage 80 which accommodates conversion of the oscillatory motion of the bell crank to rectilinear motion of the shuttle. To the opposite end of the bell crank 76 there is connected a vertically oriented output shaft 82 for a solenoid 84. As a practical matter, a lost motion linkage 86 is here employed for connecting the bell crank 76 with the output shaft 82, near its distal end, whereby rectilinear motion of the shaft is converted to oscillatory motion of the bell crank. Where desired, a tension spring 88 is provided and connected to the bell crank 76, as well as to the frame of the machine 10, in a position such as to urge the bell crank in rotation about the bearing pin 78 for retracting the shuttle 74 with respect to the magazine 54.

In view of the foregoing, it should be apparent that in response to the output shaft 82 being driven in reciprocation, the bell crank 76 is pivoted about the bearing pin 78 for imparting horizontal reciprocation to the shuttle 74. Consequently, as the shaft 82 is extended upwardly, the shuttle 74 is retracted or withdrawn from the magazine and upon the shaft 82 being retracted, the shuttle 74 is caused to extend and thus advance for engaging a pair of solar cells 12 horizontally disposed in side-by-side relation. Continued advancement of the shuttle forces the solar cells to be discharged through the throat 72.

Located in close proximity with the throat 72 of the magazine 54 there is a lift, generally designated 90. The lift 90 includes a horizontally disposed platform 92, the purpose of which is to receive a pair of solar cells 12 as they are discharged from the throat 72 of the magazine 54 in side-by-side relation. Thereafter the lift serves to elevate the pair of solar cells 12 into an engaged relationship with the substrate 16.

The platform 92, as shown in FIG. 5, is supported for reciprocation within a vertically oriented track 96 by a vertically oriented output shaft 98 comprising the output shaft for a vertically oriented solenoid 100. The solenoid 100 is mounted by means of a bracket 102 welded or otherwise secured to a vertically oriented support member 104 provided for the machine 10. Hence, it should be apparent that as the solenoid 100 is intermittently energized, the output shaft 98 thereof is driven in vertical reciprocation for advancing the platform 92 along a rectilinear path. The throw of the shaft 98 is such as to elevate the upper surface of the pair of solar cells 12 into impacting engagement with the lowermost surface of the substrate 16. In practice, the heater 94 is continuously energized so that the cells continue to preheat as they are elevated. Consequently the track 96 is provided with suitable protective insulation 106, while the upper surface of the platform 92 includes a Kapton film or layer for protecting the surface of the solar cells 12 as they are serially advanced onto the surface of the platform 92 in response to a feeding motion of the shuttle 74.

Each solar cell 12 is, of course, received by the platform 92 with the electrical contacts thereof being projected upwardly in coaxial alignment with perforations 32 provided for the solder pads 18 of the substrate 16. Consequently, once the solar cells 12 are preheated and elevated by the platform 92 into engagement with the substrate 16, heating of the solder pads 18 causes the solder to flow and to gravitate downwardly through the perforations 32 for thus wetting the adjacent surfaces of the contacts. Upon cooling the solder, wetting the surfaces of the contacts serves to effect a soldering thereof to the substrate 16.

As a practical matter, heating of the solder pads 18 is achieved through the use of an infrared soldering lamp 110 located at station A immediately above the platform 92 of the lift 90. The lamp 110 comprises a quartz iodine lamp having a gold plated parabolic reflector for purposes of supplying heat for soldering the cells to the substrate. The lamp 110 is supported to radiate through a Sylgard window positioned immediately above the plane of the substrate 16 for purposes of supporting the substrate as solar cells 12 are elevated into engagement with the substrate. This window is supported by a steel frame 114 having projected therefrom support springs 116 disposed in supporting relation with the window 112. Preferably, the Sylgard window is supported to be adjusted relative to the substrate length.

Figure 6:
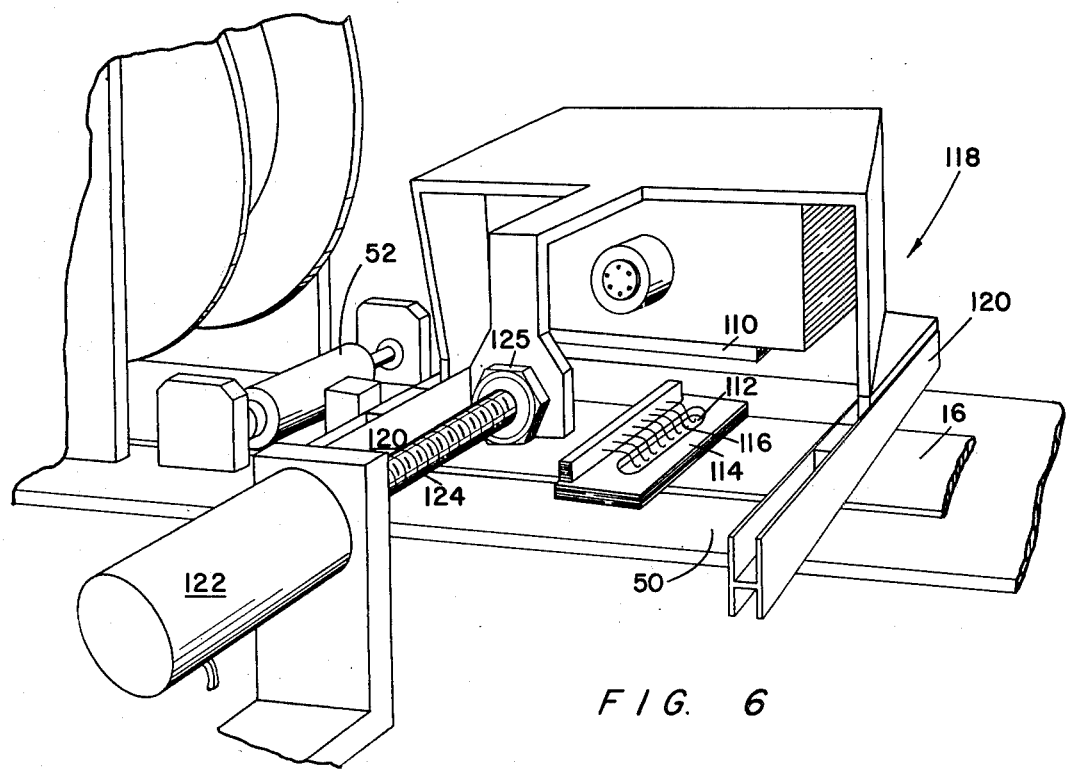
FIG. 6 is a perspective view of an infrared re-flow soldering lamp provided for use in soldering the cells to the substrate.

As best illustrated in FIG. 6, the infrared lamp 110 is supported by an assembly 118 mounted on a pair of horizontally oriented tracks 120 transversely related to window 112 above the substrate 16. A drive assembly, comprising a motor 122, is connected with a worm 124 and nut 125, provided for translating the assembly 118 along the tracks 120. Since worm and nut assemblies are well known, a detailed description of the worm 124 and the nut 125 is omitted. However, as shown, the worm 124 is threaded through the nut 125 which, in turn, is rigidly affixed to the assembly 118 so that as rotation is imparted to the worm the nut is displaced relative to the worm in axial directions.

In operation, the motor 122 is connected to drive the worm 124 in rotation whereby the worm 124 is advanced through the nut 125 and the assembly 118 is responsively advanced transversely with respect to the substrate 16. Advancement of the assembly 118 causes the solder of the solder pads 18 to flow, as the temperature thereof is elevated in response to infrared radiation of the infrared lamp 110 passed through the window 112. Of course, the temperatures to which the soldering pads 118 are raised is a function of the intensity of the infrared soldering lamp 110 and the duration of the period required by the assembly in traversing the window 112. The precise temperature required for causing the solder of the pads 18 to flow is a characteristic of the solder, and can readily be determined by those familiar with the use of such materials.

Referring again to FIGS. 1 and 2, it can be seen that station B comprises a pressurized solvent cleaning station located downstream from station A. Located at station B, there is defined an opening 126, FIG. 7. This opening is formed in the track 50 and extends substantially across the full width of the track. Within the opening 126 there is a disposed deflector 128 having a downwardly curved surface 130 transversely related to the path of the substrate 16. Preferably, the surface comprises a segment of a cylinder coaxially aligned with the longitudinal axis of serially presented pairs of solar cells 12 previously soldered to the substrate 16 in transverse alignment therewith. It is noted that the solder pads 18 serve to secure to the substrate each of the solar cells 12 along a centralized zone thereof, not designated. Consequently, the peripheral fore and aft zones of each of the cells 12, relative to the path of the substrate, are free with respect to the adjacent surfaces of the substrate 16. Consequently, by deflecting the substrate 16, transversely, the fore and aft zones of each of the cells are caused to separate from adjacent surfaces of the substrate 16 for thus permitting the opposed surfaces of the cells 12, not designated, and the substrate 16, also not designated, to assume a displaced, exposed relationship.

Thus the fore and aft zones of surfaces of the solar cells 12, opposed to the substrate 16, are exposed as the substrate 16 is passed over the curved surface 130 of the deflector 128 and thus caused to assume a horizontal, tangential relationship with the curved surface.

Figure 7:
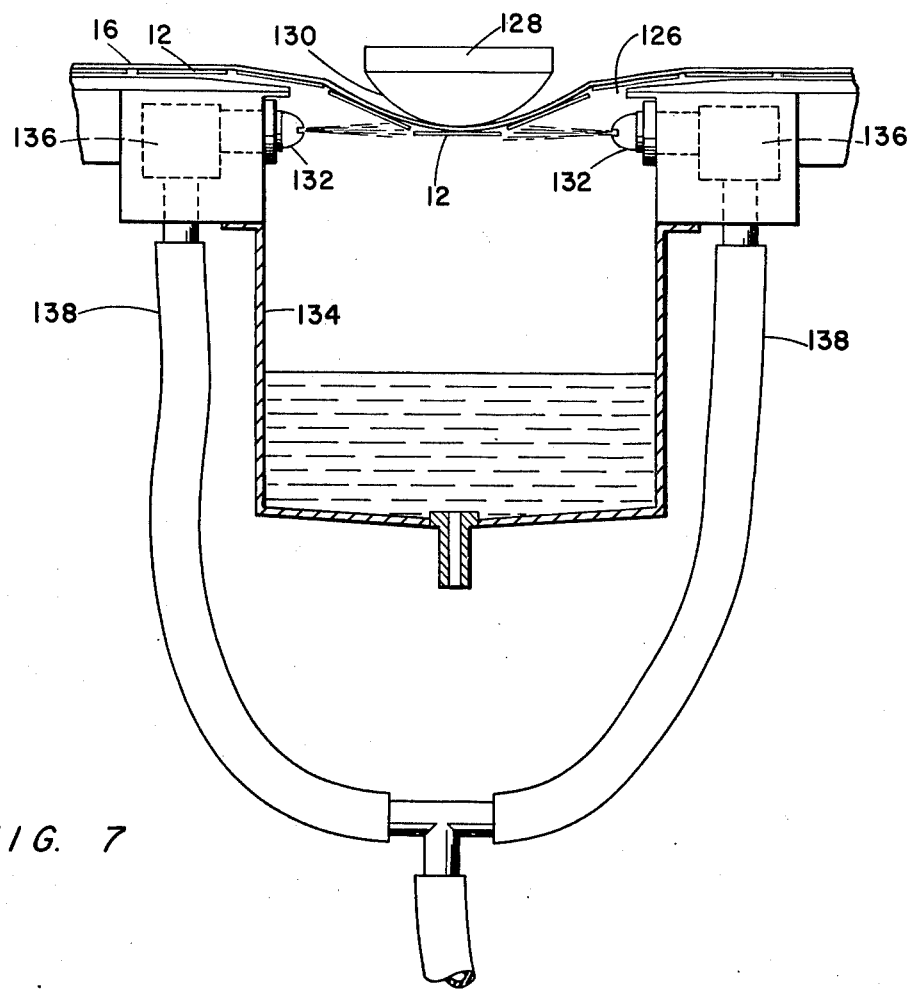
FIG. 7 is a cross sectional view taken generally along line 7—7 of FIG. 3.

In order to remove solder residue such as flux and the like from between the opposed surfaces of the solar cells 12 and the substrate 16, the exposed surfaces of the cells 12 and the substrate 16 are washed-down, pressurized by streams of solvent projected to impinge thereon. these streams are projected by a plurality of paired spray nozzles 132 having axes extended in fore and aft directions, as illustrated in FIG. 7, whereby a spray of suitable solvent is caused to impinge on the exposed surfaces for thus effecting a cleaning of the surfaces. As a practical matter, the nozzles 132 are positioned above a suitable tank designated 134, the purpose of which is to capture solvent and residue as it gravitates from the exposed surfaces.

The particular manner in which the solvent is delivered to the spray nozzles 132 forms no specific part of the instant invention. However, as illustrated, the nozzles 132 are connected with pumps, designated 136, which, in turn, are connected with a source of solvent, not shown, through suitable lines 138. The pumps 136 are of a suitable design and, preferably, are intermittently driven for achieving intermittent operation of the nozzles, whereby high pressure streams of solvent are caused to be projected simultaneously from the nozzles 132 upon the exposed surfaces of a side-by-side pair of cells 12 and the substrate. Since the particular solvent employed forms no specific part of the instant invention and is commercially available, a detailed discussion thereof is omitted in the interest of brevity. In any event, it is to be understood that solder residue is removed from between the opposed surfaces of the cell 12 and the substrate 16 as the substrate passes over the curved surface 130 of the deflector 128 and the spray is propelled in opposite directions from the nozzles 132 to impinge upon the thus exposed surfaces.

Figure 8:
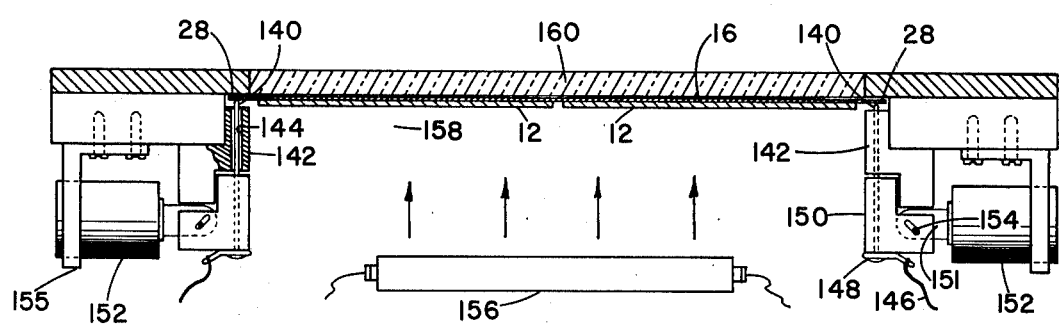
FIG. 8 is a cross sectional view taken generally along line 8—8 of FIG. 3.
Figure 11:
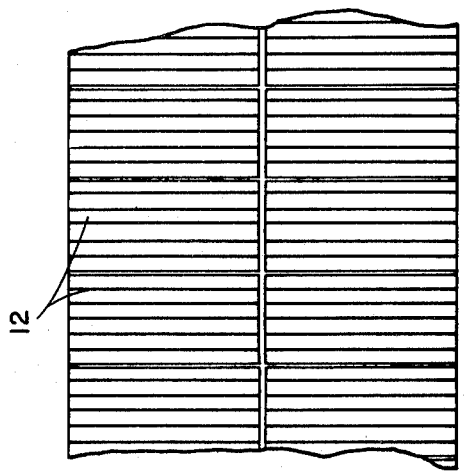
FIG. 11 is a fragmented top plan view of the solar array strip.

Having been suitably cleaned, the substrate 16 is advanced for thus causing the cells 12 to be advanced from station B to station C. At this station electrical performance testing of the solar cells 12 is performed. Turning now to FIG. 8, it can be seen that immediately beneath the opposite edge portions of the substrate 16 there is provided a pair of vertically oriented probes 140. These probes are mounted in a vertically oriented plane transversely related to the track 50. A pair of guides 142, formed of a suitable dielectric or insulating material, having bores 144 is provided for receiving the probes 140. The probes 140 are supported within the bores to be projected into contacting engagement with the strips of metallization 28 for thus establishing electrical contact therewith and thus effect an electrical connection thereof across each pair of solar cells. The probes 140 are, in turn, electrically connected to leads 146 connected at output lugs 148 for conducting an electrical current through the probes 140.

Each of the probes 140 is supported by a carrier 150 mouned for vertical reciprocation employing brackets, not shown. Each of the carriers 150 is connected with a reciprocable output shaft 151 provided for a solenoid 152. This connection is made through a cam-slot coupling 154 so configured that as the output shaft 151 is reciprocated the cam-slot coupling imparts vertical reciprocation to the carrier 150 for thus raising and lowering the probes 140. In practice, the solenoids 152 are connected within a common electrical circuit whereby a simultaneous reciprocation of the output shafts thereof may be achieved for thus causing the probes 140 to be elevated into simultaneous engagement with the strips of metallization 28.

In order to test for electrical continuity for the circuitry within which each pair of solar cells 12 an electrical current is established in the circuitry in response to incident light. A suitable light source 156 disposed beneath the solar cells 12 at station C is provided for illuminating in sequence the surfaces of each pair of solar cells 12. While the light source 156 can be varied as desired, in practice the light source 156 comprises an intermittently energizable solar simulator lamp suitable for directing rays of light at a suitable intensity toward the lower surfaces of the cells 12 as the cells are supported by the substrate 16 at the station C.

While not shown, it is to be understood an ammeter is connected with at least one of the leads 146 for purposes of detecting a flow of current through the cells 12 as a photovoltaic current is generated in response to impinging radiation propagated by the light source 156.

As a practical matter, the track 50, as shown in FIG. 8, is provided with an opening 158 for accommodating passage of the light to the surfaces of the solar cells. However, a transparent window, not shown, is utilized for supporting the cells where desired. Moreover, as shown in FIG. 8, a viewing plate 160 traverses the opening 158 in a position immediately above the surface of the substrate. Due to the transparency of the viewing plate 160 operators may view the passage of the substrate therebeneath for adjustment and similar purposes.

In view of the foregoing, it should be apparent that as the substrate bearing the solar cells 12 traverses the opening 158 the probes 140 are elevated by the solenoids 152 for engaging the strip of metallization 28, whereupon the electrical performance of the solar cell 12 is detected as a photovoltaic current is caused to flow through an ammeter, or similar metering device connected therewith.

Upon an indexing of the substrate, the cells 12 exit station C and are advanced to station D at which an encapsulation thereof in a material such as a transparent epoxy resin, or the like, is caused to occur. While the material utilized as an encapsulant may be applied in any suitable manner, including brushing, dipping and the like, an applicator 162 is preferred. The applicator 162 is typified by a pressure gun having a spray nozzle 164 upwardly directed toward the lower surface of the solar cells 12, through an opening 165 for applying a film of liquid encapsulant to the cells. As a practical matter, the encapsulant material is cured employing a resistant heating device 166 located in close proximity with the applicator.

Since the particular material employed as the encapsulant material may be varied as desired and forms no specific part of the instant invention, it is sufficient to appreciate that the material employed as an encapsulant must be compatible with the solar cells 12, the applicator 162 and the heater 166.

Following passage through station D, as the substrate is indexed, the solar cells 12 ae advanced to station E at which further electrical performance testing is performed. As a practical matter, the structure here employed duplicates the structure employed at station C, hereinbefore described. Therefore a detailed description of the electrical performance testing structure employed at station E is omitted in the interest of brevity.

However, it should be apparent that the encapsulant does not extend to coat the strips of metallization 28. Thus electrical contact is facilitated for probes 140 at station E. Following passage through station E, the solar cells and substrate are discharged as a completed solar array strip 20 preparatory to being wound about the storage drum 40 as the motor 44 imparts rotation thereto.

It should now be apparent that while the particular circuitry employed in controlling the operation of the machine is not described in detail, the circuit employed is capable of achieving synchronous operation of components of the machine located at stations A, B, C, D and E as well as the operation of the motor 44. Moreover, where desired, suitable sensors including optical switches, not shown, are employed for purposes of detecting passage of the index tabs 30 for purposes of providing intelligence to control circuits, not shown. Finally, since the specific circuitry employed in controlling the operation of the machine may be varied as desired, and is well within the purview of the art, a detailed description thereof is omitted in the interest of brevity.

OPERATION

It is believed that in view of the foregoing description of the invention, the operation thereof is fully apparent. However, in order to assure a complete understanding of the invention, the operation of the embodying machine is here briefly reviewed.

With the embodying machine 10 assembled in the manner hereinbefore described, it is prepared for operation through several preparatory steps including the mounting of a supply drum 34 for substrate 16 on the bearing structure 36 and threading the substrate through stations A, B, C, D and E and thereafter attaching the substrate to the storage drum 40.

As a practical matter, while not shown, it is to be understood that where desired, a "lead strip" is provided for the substrate 16 in order to facilitate a threading thereof through the various stations and an ultimate attachment thereof to the storage drum 40. Additionally, a lead end of the protective layer 48 is drawn from the drum 46 and attached to the storage drum 40 for facilitating a simultaneous winding of the protective layer 48 with the solar array strip 20 on the drum 40.

The machine is now activated for causing the motor 44 to be driven in synchronism with the operation solenoids 84 and 100 as well as the motor 122, at station A, the pumps 136 at station B, the solenoids 152 at stations C and E, as well as the pump for the applicator 162 at station D.

It is to be understood that as the machine is energized, the substrate 16 is indexed along the track 50 while a pair of solar cells 12 are ejected horizontally from the spring-loaded magazine 54 and deposited on the upper surface of the platform 92 for the lift 90. Thereafter, the platform is elevated, while preheating the cells 12, for bringing the solar cells into an abutting engagement with the lowermost surfaces of the substrate 16, through the opening 59. The motor 122 is now energized advancing the assembly 118 and thus causing the infrared lamp 110 to travel across the path of the substrate 16 whereupon the solder of the solder pads 18 is heated and caused to flow. As the solder is caused to flow, the adjacent preheated surfaces of the wrap around solar cell 12 is "wetted" by the solder as it flows through the perforations 32. As heat is removed, the solder "sets" for thus attaching the solar cells to the substrate.

The substrate 16 is now indexed for advancing to station B at which they are caused to pass along the curved surface 130 of the deflector 128. As a consequence, the fore and aft peripheral zones of the solar cells 12 are caused to separate from the substrate for thus exposing the opposed surfaces of the solar cells and the substrate. The pumps 136 upon being activated deliver a spray of solvent to the exposed surfaces for washing therefrom solder residue, including flux and similar materials. The cells 12 are now advanced through a further indexing of the substrate 16 for positioning the solar cells at station C.

The probes 140 at station D are elevated into engagement with the strips of metallization 28, while the solar simulator lamp 156 is energized for thus energizing the solar cells 12 whereupon a current is established. The performance of the cells 12 is tested as an electrical current is delivered through the lead 150 to suitable measuring recording circuits, not shown. Of course, the probes 140 are withdrawn downwardly following termination of the performance testing operation.

The cells 12 are next advanced to station D. As hereinbefore disclosed, a spary of encapsulating material, such as epoxy resin is delivered to the exposed surfaces of the solar cells employing a suitable applicator 162. Following application of the film of encapsulant to the surface of the cells 12, by the applicator 162, the encapsulant material is cured in response to radiation provided by the heater 166. Once the cells are removed from station D in response to an indexing displacement of the substrate 16 they are passed through station E at which a further electrical performance testing operation is conducted for the cells. Finally, the thus completed solar array strip 20 is caused to exit the machine at station E and is drawn into a helically wound configuration about the drum 40, as the protective strip 48 is fed between the helical layers of the resulting package.

In view of the foregoing, it should readily be apparent that the machine which embodies the principles of the present invention provides a practical solution to the problem of providing solar array strips economically, dependably and practically.

Although the invention has been herein shown and described in what is conceived to be the most practical and preferred embodiment, it is recognized that departures may be made therefrom within the scope of the invention, which is not to be limited to the illustrative details disclosed.

What we claim is:

1. In a machine for forming a flexible solar array strip, the combination comprising:
   A. means for feeding along a linear path a flexible substrate having printed circuitry deposited along one surface thereof;
   B. means for serially orienting silicon solar cells on said substrate;
   C. means for soldering the cells to the printed circuitry; and
   D. means for removing solder residue from the adjacent surfaces of the substrate and the cells soldered to the printed circuitry including means for separating at least a portion of the adjacent surfaces of each of said solar cells from the surfaces of the substrate for exposing opposed surfaces of the cells and the substrate, and means for applying a fluid cleaning solvent to the surfaces thus exposed.

2. The combination of claim 1 further comprising means for spirally winding on a storage drum the flexible substrate having the cells soldered thereto, and means for interwinding between adjacent layers of the strip a protective strip of resilient material.

3. The combination of claim 1 wherein printed circuit deposited on the substrate includes solder pads and the means for soldering the solar cells to the printed circuitry includes means for preheating the solar cells and means for applying heat to said substrate sufficiently for causing the solder to flow.

4. The combination of claim 1 wherein the substrate includes solder pads and the means for orienting silicon solar cells on said substrate includes a vertically reciprocable lift disposed beneath said path for serially elevating the solar cells into engagement with the solder pads, and means for serially delivering solar cells to the lift.

5. The combination of claim 4 wherein the means for soldering the cells to the printed circuitry includes first heating means disposed within said lift for preheating solar cells delivered thereto and means disposed in substantial vertical alignment with the lift for heating the substrate sufficiently for accommodating a flow of the solder of the solder pads to flow to portions of adjacent surfaces of the preheated solar cells elevated into engagement therewith.

6. The combination of claim 1 further comprising means for determining the electrical continuity of the solar cells soldered to the printed circuitry.

7. The combination of claim 6 wherein said means for determining the electrical continuity of said solar cells includes means for illuminating the surfaces of each of the solar cells and a pair of probes for engaging said printed circuitry at opposite sides of each of the illuminated solar cells.

8. The combination of claim 1 further comprising means for applying to said solar cells a protective layer of transparent material.

9. In a machine for forming a flexible solar array strip the combination comprising:
A. means for incrementally advancing along a linear path a flexible substrate having a printed circuit deposited along one surface thereof including a supply drum supported for rotation at a first location having a strip of flexible substrate wound therabout, and a storage drum supported for rotation at a second location spaced from said first location, a linear track extended between said drums, and drive means for intermittently imparting rotation to at least one of said drums; and
B. means for serially attaching solar cells to said substrate as the substrate is intermittently advanced along said linear path including a vertically reciprocable lift for elevating serially fed solar cells into engagement with solder pads providing for the printed circuit deposited on said substrate, means for applying infrared radiation to said printed circuit at an intensity and for a period of a duration sufficient to cause the solder pads to flow and wet adjacent surfaces of solar cells disposed in engagement therewith, and means for serially feeding solar cells to said lift including a spring-loaded magazine having a discharge opening adjacently related to said lift and a reciprocable shuttle for transferring each first-in-line cell from the magazine to the lift through said opening.

10. The combination of claim 9 wherein said lift comprises:
A. a horizontally oriented platform for receiving solar cells in supported relation;
B. resistance heating means mounted in said platform for preheating said solar cells as the cells are elevated into engagement with the solder pads; and
C. drive means for imparting vertical reciprocation to said platform including vertically oriented shafts connected to said platform and supported for rectilinear reciprocation.

11. The combination of claim 9 wherein said means for serially feeding solar cells to said lift further includes:
A. means for supporting said magazine in a vertical disposition in close proximity with said lift;
B. means supporting said shuttle for rectilinear reciprocation in coplanar relation with the first-in-line solar cell; and
C. intermittently operable drive means connected with the shuttle for imparting thereto rectilinear reciprocation.

12. The combination of claim 9 wherein said means for applying infrared radiation to said printed circuit includes an energizable lamp supported for transverse motion relative to said track for periodically causing radiation to impinge on the upper surface of said flexible substrate.

13. The combination of claim 9 further comprising residue removal means for cleaning solder residue from opposed surfaces of said solar cells and said substrate including means for applying cleaning solvent simultaneously to the opposed surfaces.

14. The combination of claim 13 wherein said residue removal means further includes substrate deflection means for separating the cells from the substrate at opposite sides of planes normally related to the planes of the solar cells for thus exposing the opposed surfaces of the solar cells and substrate preparatory to an application of a spray of solvent thereto, arranged in mutually opposed relation, and a pair of spray applicators each having a spray discharge orifice the axis of which projects in a plane extended between the exposed surfaces.

15. The improvement of claim 14 wherein said substrate deflection means includes a curved surface conforming to a segment of a cylinder extended downwardly into said path, and transversely with respect thereto, for depressing said substrate beneath the plane of the path, the radius of said surface being such as to cause opposite portions of said substrate to move simultaneously away from the plane of the solar cells as the substrate is advanced along said path for thus simultaneously exposing the opposed surfaces of the solar cells and substrate.

16. The combination of claim 15 further comprising means for applying to said solar cells a protective layer of transparent material and further means for examining cells attached to said substrate for electrical continuity.

17. The combination of claim 9 wherein the means for attaching solar cells to said substrate further includes a resistance heater mounted in said lift for preheating said cells as they are elevated into engagement with said solder pads.

18. The combination of claim 9 further comprising means for examining cells attached to said substrate for electrical continuity including a multiplicity of vertically reciprocable probes for engaging the printed circuit deposited along said substrate, in close proximity with said solar cells, and means for illuminating the solar cells while said probes remain in engaged relation with said printed circuit.

19. The combination of claim 17 wherein said substrate is wound in a helix about said storage drum, as rotation is imparted thereto, and further includes means for inserting a protective strip of resilient material between adjacent turns of the helix as rotation is imparted to said drum.

* * * * *